United States Patent
Moriya et al.

(10) Patent No.: US 8,389,053 B2
(45) Date of Patent: Mar. 5, 2013

(54) METHOD OF CLEANING POWDERY SOURCE SUPPLY SYSTEM, STORAGE MEDIUM, SUBSTRATE PROCESSING SYSTEM AND SUBSTRATE PROCESSING METHOD

(75) Inventors: Tsuyoshi Moriya, Nirasaki (JP); Toshio Hasegawa, Albany, NY (US); Hideaki Yamasaki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 585 days.

(21) Appl. No.: 12/593,945

(22) PCT Filed: Mar. 26, 2008

(86) PCT No.: PCT/JP2008/056509
§ 371 (c)(1),
(2), (4) Date: Nov. 23, 2009

(87) PCT Pub. No.: WO2008/120794
PCT Pub. Date: Oct. 9, 2008

(65) Prior Publication Data
US 2010/0136230 A1    Jun. 3, 2010

(30) Foreign Application Priority Data

Mar. 30, 2007 (JP) .................................. 2007-092379

(51) Int. Cl.
*B05D 1/12* (2006.01)
*C23C 16/00* (2006.01)
(52) U.S. Cl. ..................................... 427/248.1; 118/715
(58) Field of Classification Search .......................... None
See application file for complete search history.

(56) References Cited

U.S. PATENT DOCUMENTS

| | | | |
|---|---|---|---|
| 2004/0031440 A1* | 2/2004 | Chen et al. | 118/715 |
| 2005/0079708 A1* | 4/2005 | Yamasaki et al. | 438/680 |
| 2006/0086319 A1* | 4/2006 | Kasai et al. | 118/715 |
| 2009/0250006 A1* | 10/2009 | Yamasaki et al. | 118/726 |

FOREIGN PATENT DOCUMENTS

| | | |
|---|---|---|
| JP | 2 270965 | 11/1990 |
| JP | 5 44040 | 2/1993 |
| JP | 7278818 | 10/1995 |
| JP | 9 279346 | 10/1997 |
| JP | 2006 93240 | 4/2006 |
| JP | 2006 303534 | 11/2006 |
| WO | 2007 034623 | 3/2007 |

* cited by examiner

*Primary Examiner* — Joseph Miller, Jr.
(74) *Attorney, Agent, or Firm* — Oblon, Spivak, McClelland, Maier & Neustadt, L.L.P.

(57) ABSTRACT

A method of cleaning a powdery source supply system prevents outflow of particles from a chamber or an introduction line in a film forming process. A substrate processing system includes a powdery source supply system and a film forming processing unit. The powdery source supply system includes an ampoule for accommodating a powdery source, a carrier gas supply unit for supplying a carrier gas into the ampoule, an introduction line for connecting the ampoule and the film forming processing unit, a purge line branched from the introduction line, and a valve for opening or closing the introduction line. When the valve is opened and the interior of the purge line is evacuated prior to the film forming process, the carrier gas supply unit supplies a carrier gas so that the viscous force acting on particles by the carrier gas is greater than the viscous force in the film forming process.

12 Claims, 5 Drawing Sheets

METHOD OF CLEANING POWDERY SOURCE SUPPLY SYSTEM, STORAGE MEDIUM, SUBSTRATE PROCESSING SYSTEM AND SUBSTRATE PROCESSING METHOD

FIELD OF THE INVENTION

The present invention relates to a method of cleaning a powdery source supply system, a storage medium, a substrate processing system and a substrate processing method; and, more particularly, to a method of cleaning a powdery supply system for supplying a powdery source to a film forming processing unit for performing film formation on a substrate.

BACKGROUND OF THE INVENTION

In a conventional substrate processing system for performing film formation on a wafer serving as a substrate, a powdery solid source, e.g., powdery tungsten carbonyl ($W(CO)_6$) is used, as known in the art. This substrate processing system includes a chamber (ampoule) for accommodating the solid source, a film forming processing unit for performing film formation on the wafer, and a gas introduction line for introducing the solid source to the film forming processing unit by connecting the film forming processing unit and the chamber.

In this substrate processing system, the solid source is carried by a carrier gas to the film forming processing unit via the introduction line. The carried solid source is converted to a gas by a vaporizer or the like, and the gas is converted to a plasma in the film forming processing unit. Further, the film formation is performed on the wafer by the plasma (see, e.g., Japanese Patent Laid-open Publication No. 2006-93240 (FIG. 1)).

However, if the stand-by (idling) state of the substrate processing system is kept for a long period of time, powder particulates of tungsten carbonyl may grow to particles larger than the powder particulates in the introduction line or the chamber. These particles are discharged from the chamber or the introduction line during the film forming process, and then are introduced into the film forming processing unit. If the introduced particles are attached to the wafer, this may cause defects in semiconductor devices manufactured from the corresponding wafer.

SUMMARY OF THE INVENTION

The object of the present invention is to provide a method of cleaning a powdery source supply system which can prevent outflow of particles from the chamber or the introduction line during the film forming process, a storage medium, a substrate processing system and a substrate processing method.

In accordance with a first aspect of the present invention, there is provided a method of cleaning a powdery source supply system in a substrate processing system including the powdery source supply system for supplying a powdery source and a film forming processing unit for performing a film forming process on a substrate by using the supplied powdery source, the powdery source supply system having a chamber for accommodating the powdery source, a carrier gas supply unit for supplying a carrier gas into the chamber, an introduction line for connecting the chamber and the film forming processing unit and introducing a mixture of the carrier gas and the powdery source from the chamber to the film forming processing unit, a purge line branched from the introduction line and connected to a gas exhaust unit, and an opening/closing valve for opening and closing the introduction line between the film forming processing unit and a branch point from which the purge line emanates, the method comprising: a cleaning step in which the carrier gas supply unit supplies, when the opening/closing valve is closed and the interior of the purge line is evacuated prior to the film forming process by the gas exhaust unit, the carrier gas so that viscous force acting on particles by the carrier gas is greater than viscous force acting on particles by the carrier gas in the film forming process.

In the first aspect, in the cleaning step, the carrier gas supply unit may supply the carrier gas into the chamber at a supply flow rate greater than a supply flow rate in the film forming process.

In the first aspect, in the cleaning step, the carrier gas supply unit may supply the carrier gas into the chamber at a supply flow rate increased by at least 25% from the supply flow rate in the film forming process.

In the first aspect, the substrate processing system may have, between the chamber and the branch point from which the purge line emanates, an additional gas supply unit for supplying an additional gas into the introduction line, and wherein in the cleaning step, the additional gas supply unit supplies the additional gas into the introduction line at a supply flow rate smaller than a supply flow rate in the film forming process.

In the first aspect, in the cleaning step, the additional gas supply unit may supply the additional gas at a supply flow rate decreased by at least 40% from the supply flow rate in the film forming process.

In the first aspect, the cleaning step may be repeatedly performed.

In the first aspect, in the cleaning step, the carrier gas may be supplied into the chamber so that a boundary layer is formed on a surface of the powdery source in the chamber.

In accordance with a second aspect of the present invention, there is provided a computer readable storage medium storing a program for executing on a computer a method of cleaning a powdery source supply system in a substrate processing system including the powdery source supply system for supplying a powdery source and a film forming processing unit for performing a film forming process on a substrate by using the supplied powdery source, wherein the powdery source supply system has a chamber for accommodating the powdery source, a carrier gas supply unit for supplying a carrier gas into the chamber, an introduction line for connecting the chamber and the film forming processing unit and introducing a mixture of the carrier gas and the powdery source from the chamber to the film forming processing unit, a purge line branched from the introduction line and connected to a gas exhaust unit, and an opening/closing valve for opening and closing the introduction line between the film forming processing unit and a branch point from which the purge line emanates, and wherein the method includes a cleaning step in which the carrier gas supply unit supplies, when the opening/closing valve is closed and the interior of the purge line is evacuated prior to film forming process by the gas exhaust unit, the carrier gas so that viscous force acting on particles by the carrier gas is greater than viscous force acting on particles by the carrier gas in the film forming process.

In accordance with a third aspect of the present invention, there is provided a substrate processing system comprising a powdery source supply system for supplying a powdery source and a film forming processing unit for performing a film forming process on a substrate by using the supplied powdery source, the powdery source supply system including a chamber for accommodating the powdery source, a carrier gas supply unit for supplying a carrier gas into the chamber, an introduction line for connecting the chamber and the film forming processing unit and introducing a mixture of the carrier gas and the powdery source from the chamber to the film forming processing unit, a purge line branched from the introduction line and connected to a gas exhaust unit, and an opening/closing valve for opening and closing the introduction line between the film forming processing unit and a branch point from which the purge line emanates, wherein when the opening/closing valve is closed and the interior of the purge line is evacuated prior to film forming process by the gas exhaust unit, the carrier gas supply unit supplies the carrier gas so that viscous force acting on particles by the carrier gas is greater than viscous force acting on particles by the carrier gas in the film forming process.

In the third aspect, the purge line may have a pressure control valve.

In the third aspect, the purge line may have a conductance greater than a conductance of the introduction line provided between the film forming processing unit and the branch point from which the purge line emanates.

In the third aspect, the chamber may have an ultrasonic vibration generator.

In the third aspect, the introduction line may be provided with a heater.

In accordance with a fourth aspect of the present invention, there is provided a substrate processing method for performing the film forming process on the substrate after performing the method of cleaning a powdery source supply system of the first aspect.

BRIEF DESCRIPTION OF THE DRAWINGS

FIG. 5 offers a graph showing variation in the number of attached particles which is caused by performance/non-performance of a pre-purge process or the like.

DETAILED DESCRIPTION OF THE EMBODIMENT

Hereinafter, the embodiments of the present invention will be described with reference to the accompanying drawings which form a part hereof.

First of all, a substrate processing system in accordance with a first embodiment of the present invention will be described.

Figure 1:
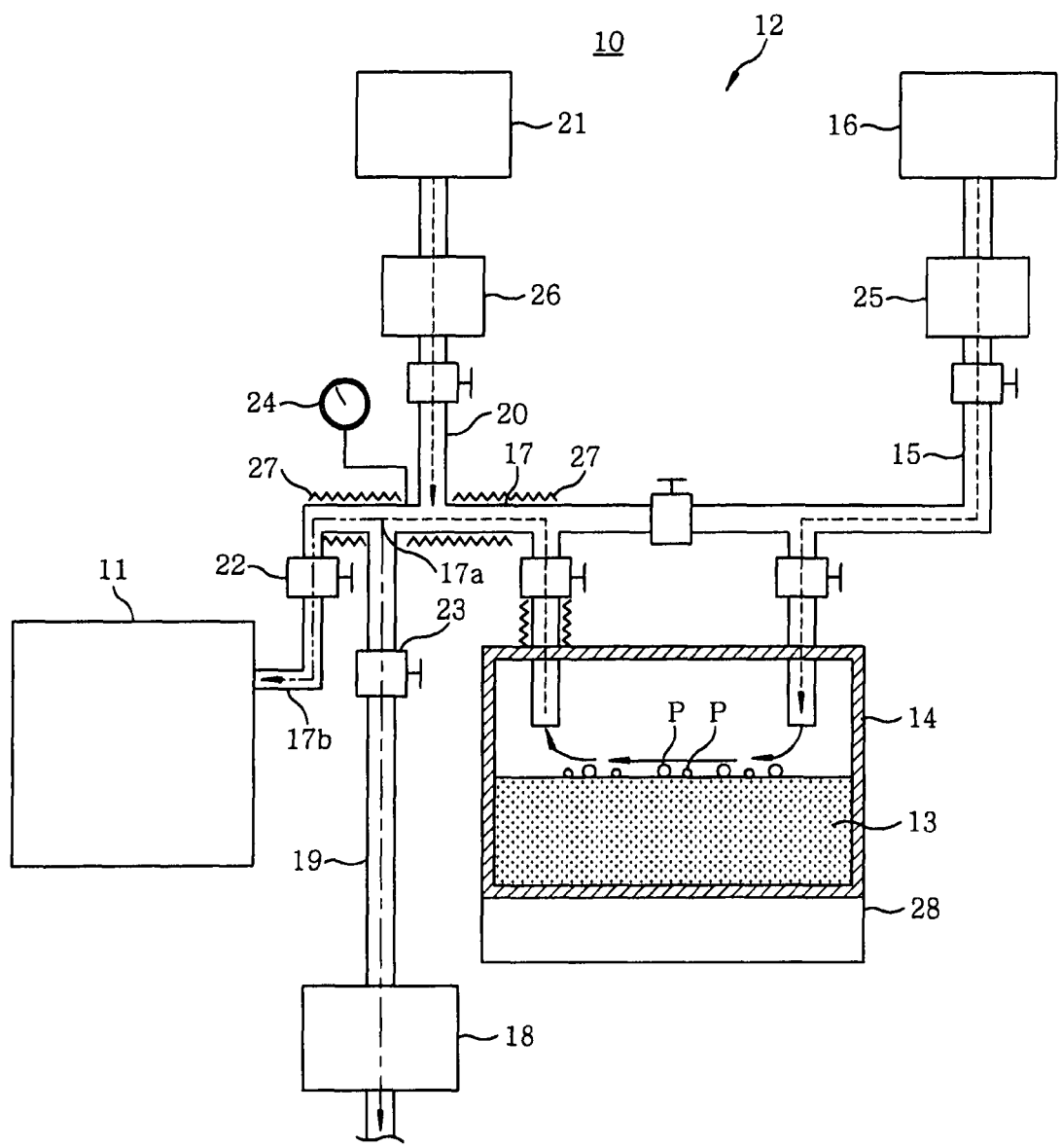
FIG. 1 schematically shows a configuration of a substrate processing system in accordance with a first embodiment of the present invention.

FIG. 1 schematically shows a configuration of the substrate processing system in accordance with the first embodiment of the present invention.

Referring to FIG. 1, a substrate processing system 10 includes a film forming processing unit 11 for performing film formation, e.g., Metal Organic Chemical Vapor Deposition (MOCVD), on a wafer (not shown) serving as a substrate and a powdery source supply system 12 for supplying powdery tungsten carbonyl as a source for film formation to the film forming processing unit 11.

The film forming processing unit 11 has a vessel (not shown) accommodating a wafer. In the film forming processing unit 11, gaseous tungsten carbonyl is supplied to the wafer accommodated in the chamber, and the film formation is carried out by the gaseous tungsten carbonyl.

The powdery source supply system 12 has an ampoule (chamber) 14 for accommodating a powdery source 13 of powdery tungsten carbonyl, a carrier gas supply unit 16 for supplying a carrier gas, e.g., Ar gas, into the ampoule 14 via a carrier gas supply line 15, a powdery source introduction line 17 for connecting the ampoule 14 and the film forming processing unit 11, and a purge line 19 branched from the powdery source introduction line 17 at a branch point 17a and connected to a dry pump (gas exhaust unit) 18.

In the powdery source supply system 12, the carrier gas supply unit 16 supplies Ar gas at a predetermined flow rate into the ampoule 14 via the carrier gas supply line 15, and the corresponding Ar gas blows up tungsten carbonyl serving as a powdery source 13. The carried tungsten carbonyl is mixed with the carrier gas to become a gas-solid mixture. The corresponding mixture is introduced into the film forming processing unit 11.

Further, of course, a source gas, e.g., gaseous tungsten carbonyl vaporized in the ampoule 14, is introduced into the film forming processing unit during the film forming process.

Moreover, the powdery source supply system 12 has an additional gas supply unit 21 for supplying an additional gas, e.g., Ar gas, into the powdery source introduction line 17 via the additional gas supply line 20. The additional gas supply line 20 is connected to the powdery source introduction line 17 between the ampoule 14 and a branch point 17a. The additional gas supply unit 21 adds an additional gas to the mixture flowing in the powdery source introduction line 17 to increase the entire flow rate. Accordingly, the mixture is stably introduced into the film forming processing unit 11.

In FIG. 1, a flow path of the carrier gas in the carrier gas supply line 15, a flow path of the mixture in the powdery source introduction line 17, and a flow path of the additional gas in the additional gas supply line 20 are indicated by dotted lines.

The powdery source introduction line 17 has a small-diameter part 17b having a diameter smaller than that of the purge line 19 and an opening/closing valve 22 arranged in the small-diameter part 17b to open and close the small-diameter part 17b, between the film forming processing unit 11 and the branch point 17a. Further, the purge line 19 has a pressure control valve 23. When the opening/closing valve 22 is opened and the pressure control valve 23 is closed, the carrier gas, the additional gas and the like flow into the film forming processing unit 11 (indicated by a double dotted line in the drawing). When the opening/closing valve 22 is closed and the pressure control valve 23 is opened, the carrier gas, the additional gas and the like flow into the dry pump 18 (indicated by a single dotted line in the drawing) without flowing into the film forming processing unit 11. Here, since the purge line 19 has a diameter larger than that of the small-diameter part 17b, a conductance of the purge line 19 is greater than that of the small-diameter part 17b.

In addition, the purge line 19 communicates with the interior of the powdery source supply line 17 and also communicates with the interior of the ampoule 14 via the powdery source supply line 17. Therefore, the pressure control valve 23 can control a pressure in the interior of the ampoule 14 or the interior of the powdery source supply line 17 (hereinafter, simply referred to as "the interior of the ampoule 14 or the like") as well as a pressure in the interior of the purge line 19. Further, a pressure gauge 24 is provided near the branch point 17a and measures a pressure in the interior of the powdery source introduction line 17.

The carrier gas supply line 15 is provided with a flow rate controller 25, and the additional gas supply line 20 is provided with a flow rate controller 26. The flow rate controllers 25 and 26 control the flow rate of the carrier gas supplied by the carrier gas supply unit 16 and that of the additional gas supplied by the additional gas supply unit 21, respectively.

A heater 27 is provided around the powdery source introduction line 17 and heats the powdery source introduction line 17. Moreover, an ultrasonic vibration generator 28 is provided at the ampoule 14 and applies ultrasonic vibration to the ampoule 14.

If the stand-by state of the substrate processing system 10 is kept for a long period of time, powder particulates of tungsten carbonyl grow to particles P larger than the powder particulates in the interior of the ampoule 14 or the like. In this embodiment, however, the particles P are removed by using the viscous force of the carrier gas prior to the film forming process.

Figure 2:
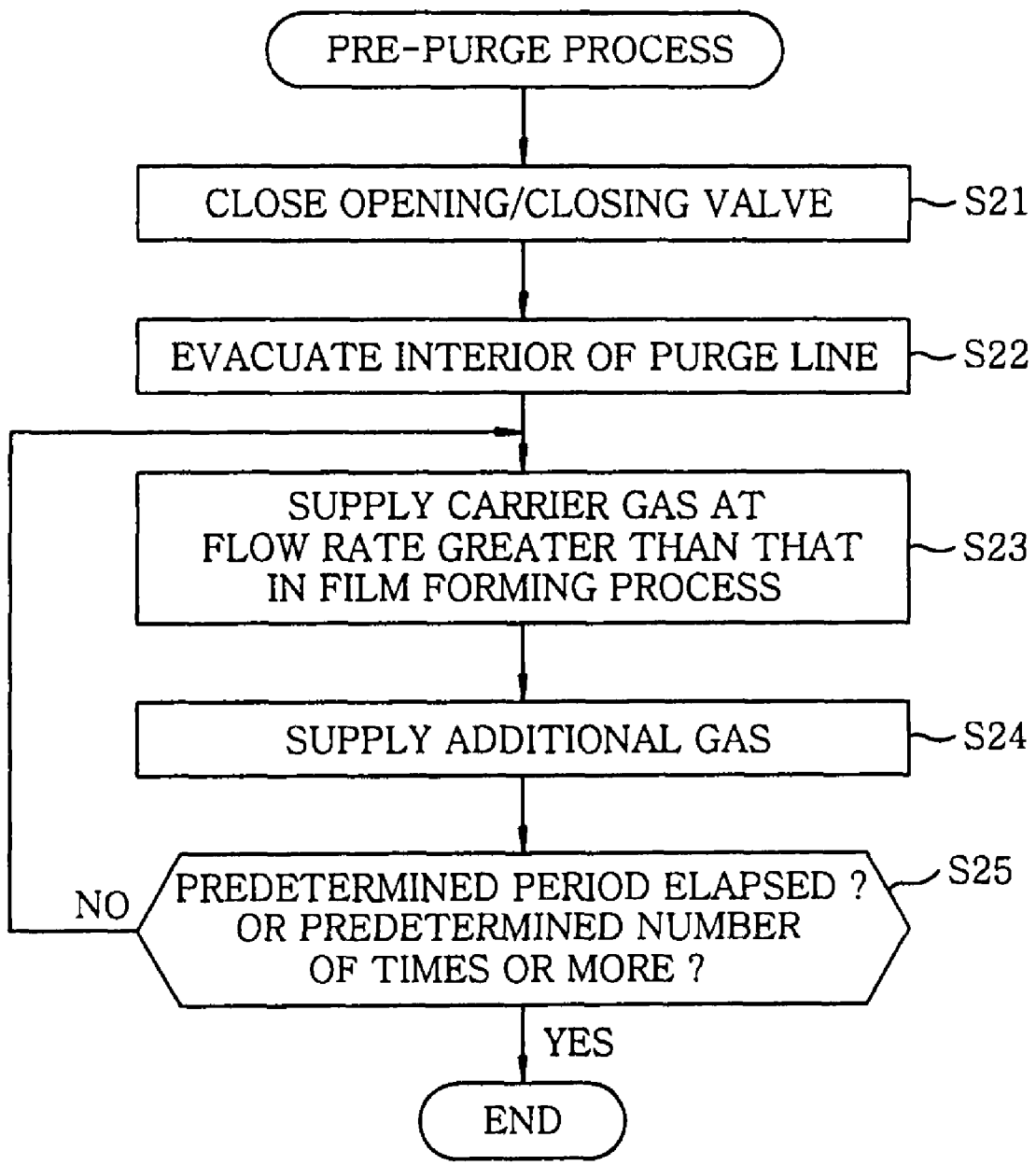
FIG. 2 provides a flowchart illustrating a pre-purge process as a method of cleaning a powdery source supply system in accordance with this embodiment.

FIG. 2 is a flowchart illustrating a pre-purge process as a method of cleaning a powdery source supply system in accordance with this embodiment. The pre-purge process is performed prior to the film forming process of the film forming processing unit 11 in the substrate processing system 10.

Referring to FIG. 2, first of all, the opening/closing valve 22 is closed, and the pressure control valve 23 is opened (step S21). Accordingly, a flow path (indicated by the single dotted line in FIG. 1) extending from the ampoule 14 to the dry pump 18 via the powdery source introduction line 17 and the purge line 19 is formed.

Next, the interior of the purge line 19 is evacuated by the constantly operating dry pump 18 via the formed flow path (step S22), and the carrier gas supply unit 16 supplies the carrier gas into the ampoule 14 and then into the powdery source introduction line 17 via the ampoule 14. The supply flow rate of the carrier gas at this time is set to be greater than that of the carrier gas in the film forming process (step S23) (cleaning step).

Generally, viscous force acting on spherical particles by the carrier gas is calculated by the following Eq. 1:

$$F = \frac{nmv^2 \pi d^2}{4}, \quad \text{Eq. 1}$$

where F indicates the viscous force of the carrier gas; n represents a molecular density of the carrier gas; m denotes a molecular weight of the carrier gas; v indicates a flow velocity of the carrier gas; and d represents a diameter of particles.

Generally, the molecular density n is in proportion to the pressure, and the flow velocity v is in proportion to the flow rate and in inverse proportion to the pressure, as represented by the following Eq. (2):

$$n \propto \text{pressure}, \quad v \propto \frac{\text{flowrate}}{\text{pressure}}. \quad \text{Eq. 2}$$

Therefore, the viscous force F of the carrier gas is in proportion to the square of the flow rate of the carrier gas, and is in inverse proportion to the pressure in the interior of the ampoule 14 or the interior of the powdery source introduction line 17, as represented by the following Eq. (3):

$$F \propto k \cdot \frac{(\text{flowrate})^2}{\text{pressure}} \quad \text{Eq. 3}$$

$$\text{where } k = \frac{m \pi d^2}{4}.$$

In step S23, the supply flow rate of the carrier gas is specifically set to 100 sccm which is a 25% increase from a flow rate (80 sccm) of the carrier gas supplied in the film forming process. Accordingly, viscous force greater than that in the film forming process can act on the particles P in the interior of the ampoule 14 or the like. As a result, not only the particles P moving by the viscous force in the film forming process but also particles P larger than those particles P can be moved from the interior of the ampoule 14 or the like.

Next, the additional gas supply unit 21 supplies an additional gas into the powdery source introduction line 17 (step S24). At this time, the flow rate of the additional gas supplied by the additional gas supply unit 21 is set to 480 sccm slightly smaller than the flow rate (500 sccm) of the additional gas supplied in the film forming process. Here, the additional gas is added to the mixture of the carrier gas and the particles P moved from the ampoule 14. Since the opening/closing valve 22 is closed and the pressure control valve 23 is opened, the mixture is discharged out of the substrate processing system 10 through the purge line 19 without flowing in the small-diameter part 17b. Consequently, the particles P are removed from the interior of the ampoule 14 or the like.

In step S25, it is determined whether a predetermined period of time has elapsed from the start of evacuation of the purge line 19, or whether step S23 has been performed a predetermined number of times or more. If it is determined that a predetermined period of time has not elapsed and that step S23 has not been performed a predetermined number of times or more, the process returns to step S23 to thereby continue the supply of the carrier gas and the like. On the contrary, if it is determined that a predetermined period of time has elapsed or step S23 has been performed a predetermined number of times or more, this process is completed. Further, a predetermined period of time in step S25 is set to, e.g., a period of time, which is required to completely remove the particles P from the interior of the ampoule 14 or the like, and which has been examined in advance by a test or the like. Specifically, a predetermined period of time is set to, e.g., 1 second. Moreover, a predetermined number of times in step S25 is set to, e.g., the number of times step S23 is executed, which is required to completely remove the particles P from the interior of the ampoule 14 or the like, and which has been examined in advance by a test or the like.

In accordance with the processing shown in FIG. 2, when the opening/closing valve 22 is closed and the interior of the purge line 19 is evacuated by the dry pump 18 prior to the film forming process, the carrier gas supply unit 16 supplies the carrier gas into the ampoule 14 and then into the powdery source introduction line 17 via the ampoule 14 at a flow rate greater than that of the carrier gas supplied in the film forming process. Therefore, the flow rate of the carrier gas in the interior of the ampoule 14 or the like can be increased. Here, as shown in Eq. (3), the viscous force of the carrier gas acting on the particles P is in proportion to the square of the flow rate of the carrier gas, so that the viscous force acting on the particles P in the interior of the ampoule 14 or the like can be made greater than that in the film forming process. As a result, not only the particles P moving by the viscous force in the film forming process but also particles P larger than those particles P can be moved prior to the film forming process. Moreover, the moving particles P are sent to the purge line 19, without being sent to the small-diameter part 17*b*, by the exhaust flow in the purge line 19 and then discharged from the purge line 19. In other words, most of the particles P that have a possibility to move by the viscous force in the film forming process can be removed from the interior of the ampoule 14 or the like prior to the film forming process. As a result, it is possible to prevent outflow of the particles P from the interior of the ampoule 14 or the like in the film forming process.

In the processing of FIG. 2, step S23 serving as a cleaning step is repeatedly carried out, so that the particles P can be reliably removed from the interior of the ampoule 14 or the like of the substrate processing system. If the particles P can be completely removed by executing step S23 once, it is unnecessary to repeat step S23. Moreover, the completion/non-completion of the processing of FIG. 2 may be determined, not based on whether a predetermined period of time has elapsed or whether the step has been performed a predetermined number of time or more, but based on a detection result of an end point detector for detecting an end point of the process of removing the particles from the interior of the ampoule 14 or the like.

Figure 3:
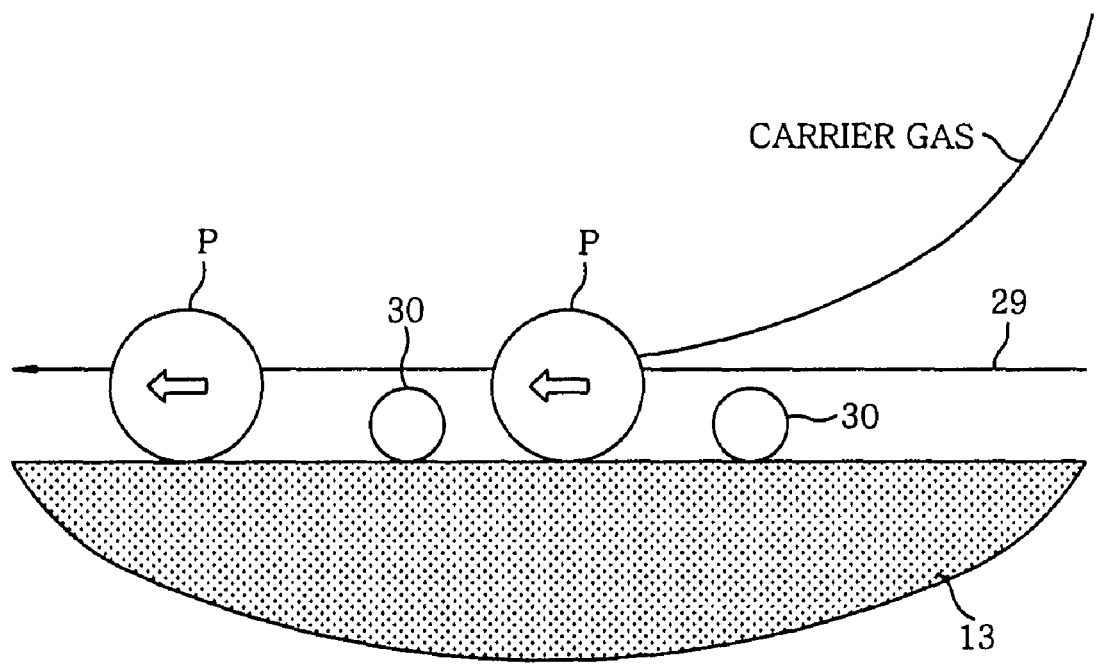
FIG. 3 schematically illustrates a boundary layer formed on a surface of a powdery source in an ampoule shown in FIG. 1.

In step S23, a boundary layer may be formed on the surface of the powdery source 13 in the ampoule 14 by controlling a flow rate of the supplied carrier gas or a pressure in the interior of the ampoule 14. Since a thickness of the boundary layer is a few μm, the particles P protrude from the boundary layer 29 whereas powder particulates 30 of the powdery source 13 do not protrude from the boundary layer 29 as shown in FIG. 3. Here, the flow of the carrier gas is not generated below the boundary layer 29, so that the viscous force does not act on the powder particulates 30 which do not protrude from the boundary layer 29. On the other hand, the flow of the carrier gas is generated above the boundary layer 29, so that the viscous force acts on the particles P protruding from the boundary layer 29. Accordingly, the particles P can be selectively removed from the ampoule 14. Further, in order to form the boundary layer in the ampoule 14, it is required to set a pressure in at least the interior of the ampoule 14 to be 133 Pa (1 Torr) or more. Accordingly, in the case of forming the boundary layer, it is preferable to set the pressure in the interior of the ampoule 14 to be 133 Pa or more.

Although the supply flow rate of the carrier gas from the carrier gas supply unit 16 is increased in step S23, the excessive increase of the supply flow rate may result in removal of most of the powdery source 13 from the ampoule 14 prior to the film forming process by blowing up most of the powdery source 13. Therefore, the supply flow rate of the carrier gas in the step S23 has an upper limit. It has been found in the experiment performed by the inventors of the present invention that the upper limit is, e.g., 200 sccm (150% increase from the flow rate of the carrier gas in the film forming process). Further, in the step S23, the supply flow rate of the carrier gas is set to 100 sccm which is a 25% increase from the supply flow rate (80 sccm) of the carrier gas in the film forming process. However, it has been found in the experiment performed by the inventors of the present invention that if the supply flow rate of the carrier gas is set to 88 sccm which is a 10% increase of the supply flow rate of the carrier gas in the film forming process, the particles P moving by the viscous force in the film forming process can be moved from the interior of the ampoule 14 or the like.

In the above-described substrate processing system 10, the ampoule 14 has the ultrasonic vibration generator 28. When ultrasonic vibration is applied to the ampoule 14, the particles P float toward the surface of the powdery source in the ampoule 14. Therefore, the particles P can be exposed to the flow of carrier gas and, hence, the viscous force can reliably act on the particles P.

Further, in the above-described substrate processing system 10, the powdery source introduction line 17 is provided with the heater 27. The heater 27 heats the powdery source introduction line 17, so that the removal of the particles P from the powdery source introduction line 17 can be facilitated by thermal stress.

Moreover, the powdery source introduction line 17 may be vibrated by a vibration exciter or the like. Accordingly, it is possible to facilitate peeling-off of the particles P from an inner wall of the powdery source introduction line 17. As a result, the removal of the particles P can be facilitated.

Although the above-described substrate processing system 10 has the additional gas supply unit 21, the substrate processing system 10 does not necessarily have the additional gas supply unit 21 as long as the mixture (the mixture of the particles P and the carrier gas) flowing in the powdery source introduction line 17 can be stably introduced into the film forming processing unit 11.

Hereinafter, a method of cleaning a powdery source supply system and a substrate processing system in accordance with a second embodiment of the present invention will be described.

The method of cleaning a powdery source supply system of this embodiment is different from that of the first embodiment in the supply flow rate of the carrier gas or that of the additional gas. Therefore, the description of the same configurations and operations will be omitted, and only different configurations and operations will be described.

Figure 4:
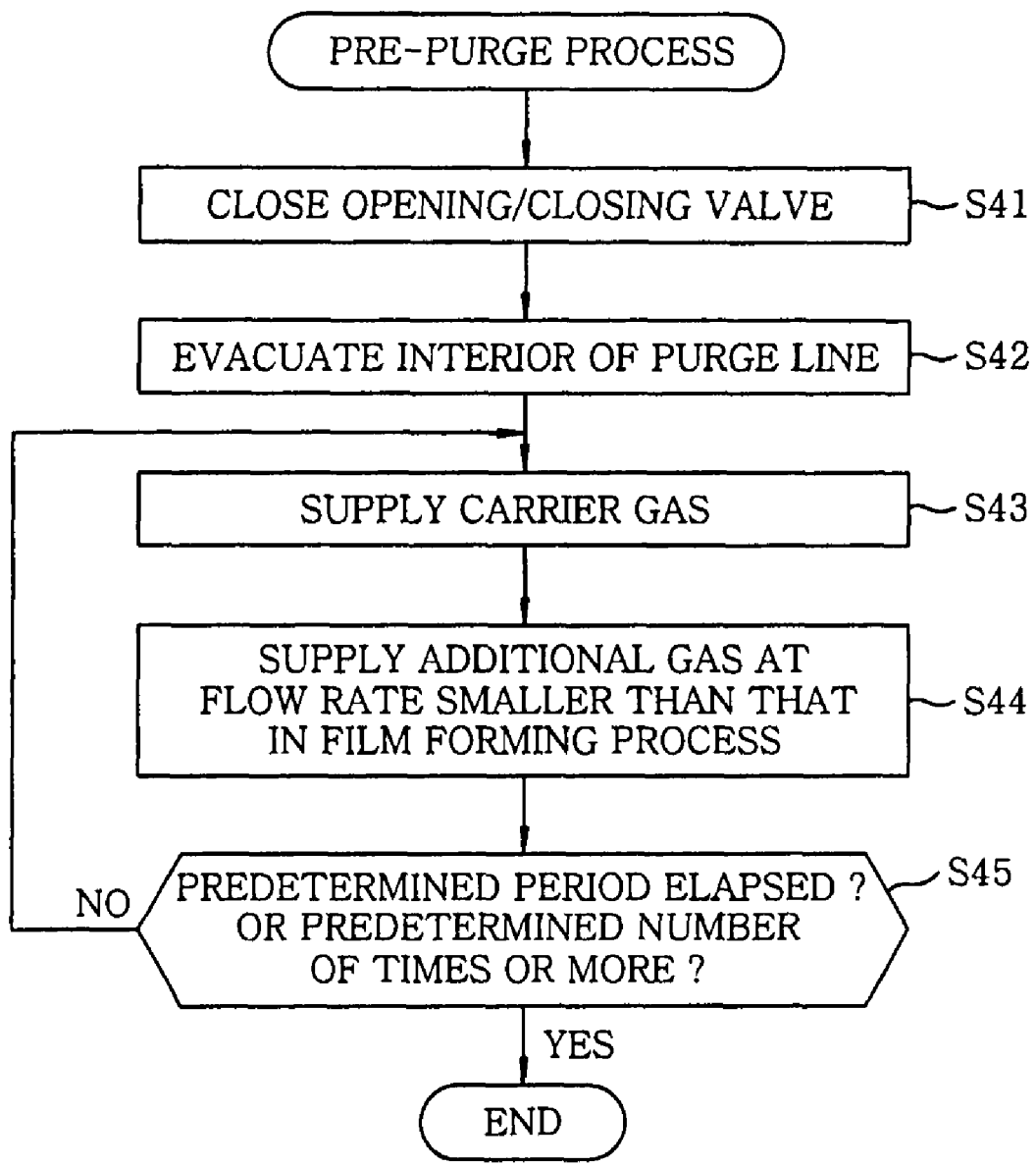
FIG. 4 presents a flowchart depicting a pre-purge process as a method of cleaning a powdery source supply system in accordance with a second embodiment of the present invention.

FIG. 4 offers a flowchart showing a pre-purge process as the method of cleaning a powdery source supply system of this embodiment. This pre-purge process is performed prior to the film forming process of the film forming processing unit 11 in the substrate processing system 10.

Referring to FIG. 4, first of all, the opening/closing valve 22 is closed, and the pressure control valve 23 is opened (step S41). Then, the interior of the purge line 19 is evacuated by the dry pump 18 (step S42).

Thereafter, the carrier gas supply unit 16 supplies a carrier gas into the ampoule 14 and then into the powdery source introduction line 17 via the ampoule 14. The supply flow rate of the carrier gas at this time is set to 80 sccm which is the same as the supply flow rate (80 sccm) of the carrier gas in the film forming process (step S43).

Then, the additional gas supply unit 21 supplies an additional gas into the powdery source introduction line 17 (step S44) (cleaning step). At this time, the supply flow rate of the additional gas supplied by the additional gas supply unit 21 is set to be smaller than the supply flow rate (500 sccm) of the additional gas in the film forming process. To be specific, it is set to 300 sccm which is a 40% decrease from the supply flow rate in the film forming process. The supplied additional gas is added to the mixture of the carrier gas and the particles P moved from the ampoule 14.

In step S44, the supply flow rate of the additional gas decreases compared to that of the additional gas in the film forming process. Thus, the amount of the additional gas exhausted by the dry pump 18 through the purge line 19 decreases, and a larger amount of the carrier gas can be exhausted by the dry pump 18. As a consequence, the pressure in the interior of the ampoule 14 or the interior of the powdery source introduction line 17 can be reduced compared to the pressure in the film forming process. Further, as described in Eq. (3), the viscous force of the carrier gas is in inverse proportion to the pressure in the interior of the ampoule 14 or the interior of the powdery source introduction line 17. Accordingly, the viscous force acting on the particles P in the interior of the ampoule 14 or the like can become greater than the viscous force in the film forming process. As a result, not only the particles P moving by the viscous force in the film forming process but also particles P larger than those particles P can be moved from the interior of the ampoule 14 or the like.

Moreover, in step S44, the opening/closing valve 22 is closed and the pressure control valve 23 is opened, so that the particles P are removed from the interior of the ampoule 14 or the like through the purge line 19.

Next, in step S45, it is determined whether a predetermined period of time has elapsed from the start of evacuation of the purge line 19, or whether step S44 has been performed a predetermined number of times or more. If it is determined that a predetermined period of time has not elapsed, and step S44 has not been performed a predetermined number of times or more, the process returns to step S43 to thereby continue the supply of the additional gas and the like. On the contrary, if it is determined that a predetermined period of time has elapsed or step S44 has been performed a predetermined number of times or more, this process is completed. Further, a predetermined period of time in step S45 is the same as that in step S25 of FIG. 2. Moreover, a predetermined number of times in step S45 is set to, e.g., the number of times of executing step S44, which is required to completely remove the particles P from the interior of the ampoule 14 or the like and which has been examined in advance by a test or the like.

In accordance with the processing of FIG. 4, when the opening/closing valve 22 is closed and the interior of the purge line 19 is evacuated by the dry pump 18 prior to the film forming process, the additional gas supply unit 21 supplies the additional gas into the powdery source introduction line 17 at a supply flow rate smaller than that of the additional gas in the film forming process. Therefore, the amount of the additional gas exhausted by the dry pump 18 through the purge line 19 decreases, and a larger amount of the carrier gas can be exhausted by the dry pump 18. Accordingly, the pressure in the interior of the ampoule 14 or the interior of the powdery source introduction line 17 can be decreased. Here, as shown in Eq. (3), the viscous force of the carrier gas acting on the particles P is in inverse proportion to the pressure in the interior of the ampoule 14 or the interior of the powdery source supply line 17, so that the viscous force acting on the particles P in the ampoule 14 or the like can be made greater than the viscous force in the film forming process. As a result, the same effects obtained in the first embodiment can be achieved.

Moreover, the completion/non-completion of the processing of FIG. 4 may be determined, not based on whether a predetermined period of time has elapsed or whether the step has been performed a predetermined number of time or more, but based on a detection result of an end point detector for detecting an end point of a process of removing the particles from the interior of the ampoule 14 or the like.

Further, in step S44, the supply flow rate of the additional gas is set to 300 sccm which is a 40% decrease from the supply flow rate (500 sccm) of the additional gas in the film forming process. However, it has been found in the experiment performed by the inventors of the present invention that if the supply flow rate of the additional gas is set to about 450 sccm which is a 10% decrease of the supply flow rate of the additional gas in the film forming process, the particles P moving by the viscous force in the film forming process can be moved from the interior of the ampoule 14 or the like.

In the above-described substrate processing system 10, the purge line 19 is provided with the pressure control valve 23, so that the corresponding pressure control valve 23 can control the pressure in the interior of the ampoule 14 or the like to a desired low pressure via the purge line 19. As a result, it is possible to surely make the viscous force acting on the particles P greater than the viscous force in the film forming process. Further, it has been found in the experiment performed by the inventors of the present invention that the viscous force of the carrier gas does not act when the pressure in the interior of the ampoule is lower than or equal to 133 Pa (1 Torr). Therefore, during the pre-purge process, the pressure in the interior of the ampoule 14 is controlled not to be lower than or equal to 133 Pa by the pressure control valve 23 in the substrate processing system 10.

Further, in the above-described substrate processing system 10, the conductance of the purge line 19 is greater than that of the small-diameter part 17b of the powdery source introduction line 17. Therefore, the carrier gas flowing in the purge line 19 can be easily discharged compared to the carrier gas flowing in the small-diameter part 17b in the film forming process. Accordingly, the pressure of the carrier gas in the ampoule 14 or the powdery source introduction line 17 can be decreased. As a result, it is possible to more surely make the viscous force acting on the particles P greater than the viscous force in the film forming process.

In the aforementioned embodiments, the purge line 19 is branched from the powdery source introduction line 17. However, the substrate processing system 10 may have, instead of the purge line 19, a special purge line communicating with the interior of the ampoule 14. In that case, the particles P moving by the viscous force of the carrier gas may be discharged from the special purge line.

Further, although Ar gas is supplied by the carrier gas supply unit 16 and the additional gas supply unit 21 in the aforementioned embodiments, a nonreactive gas may be supplied. The carrier gas supply unit 16 and the like may supply $N_2$ gas, a rare gas such as Xe gas, Kr gas or the like.

It is to be understood that the object of the present invention can also be attained by supplying to a computer a storage medium storing program codes of software for realizing the functions of the aforementioned embodiments, and then causing a CPU of the computer to read out and execute the program codes stored in the storage medium.

In this case, the program codes themselves read out from the storage medium realize the functions of the aforementioned embodiments and, hence, the program codes and the storage medium storing the program codes are included in the present invention.

Moreover, the storage medium for supplying the program codes may be, e.g., a RAM, a NV-RAM, a floppy (registered trademark) disk, a hard disk, a magneto-optical disk, an optical disk such as a CD-ROM, a CD-R, a CD-RW, a DVD (a DVD-ROM, a DVD-RAM, a DVD-RW, or a DVD+RW), a magnetic tape, a non-volatile memory card, another ROM or the like. Alternatively, the program codes may be downloaded from database or a computer (not shown) connected to the Internet, a commercial network, a local area network (LAN) or the like and then supplied to the computer.

Besides, it is to be understood that the functions of the aforementioned embodiments may be accomplished not only by executing the program codes read out by the computer, but also by causing an OS (operating system) or the like that operates on the CPU to perform a part or all of the actual operations based on instructions of the program codes.

Furthermore, it is to be understood that the functions of the aforementioned embodiments may also be accomplished by writing the program codes read out from the storage medium into a memory provided on a function extension board inserted into the computer or in a function extension unit connected to the computer, and then causing the CPU or the like provided on the function extension board or in the function extension unit to perform a part or all of the actual operations based on instructions of the program codes.

The program codes may be, e.g., object codes, program codes executed by an interpreter, script data supplied to the OS or the like.

TEST EXAMPLES

Hereinafter, test examples of the present invention will be described.

Test Example 1

First, the processing of FIG. 2 was performed in the substrate processing system 10 kept at the stand-by state for a long period of time and, then, the film forming process was performed on two wafers in the film forming processing unit 11. Next, the number of particles, having a size of 0.10 μm or more, attached to the surface of each wafer after the film forming process was measured by a particle counter or the like. A result thereof is shown in a graph of FIG. 5.

Test Example 2

Figure 5:
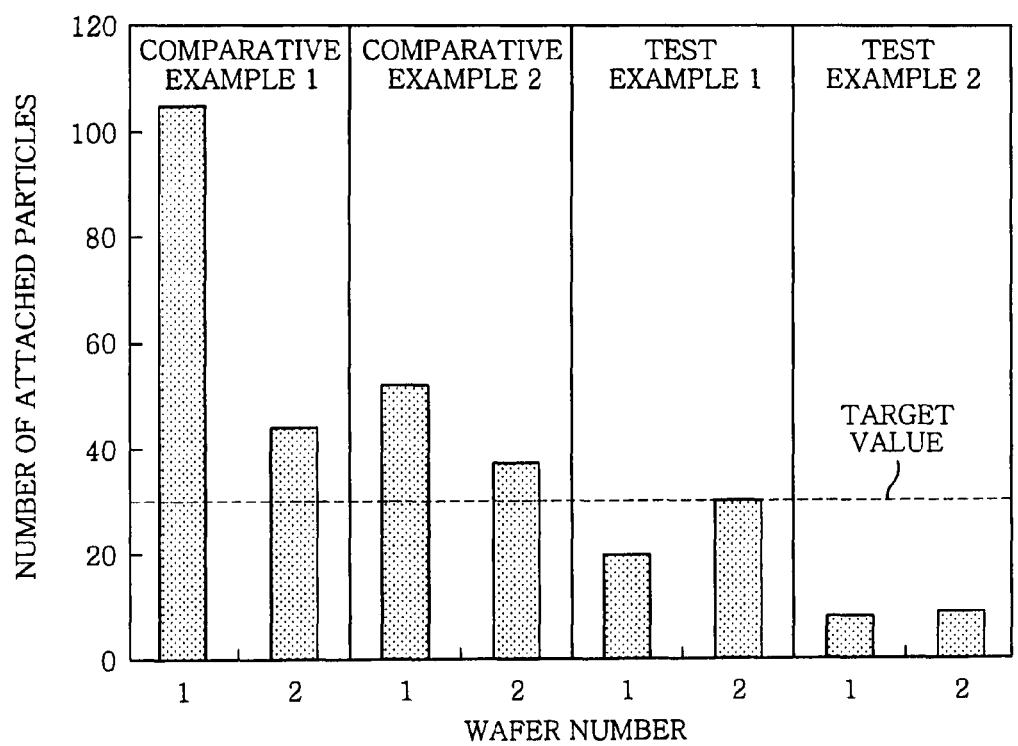

First, the processing of FIG. 4 was performed in the substrate processing system 10 kept at the stand-by state for a long period of time and, then, the film forming process was performed on two wafers in the film forming processing unit 11. Next, the number of particles, having a size of 0.10 μm or more, attached to the surface of each wafer after the film forming process was measured by a particle counter or the like. A result thereof is shown in the graph of FIG. 5.

Comparative Example 1

The film forming process was performed on two wafers in the film forming processing unit 11 without performing the processing shown in FIG. 2 or 4 in the substrate processing system 10 kept at the stand-by state for a long period of time. Next, the number of particles, having a size of 0.10 μm or more, attached to the surface of each wafer after the film forming process was measured by a particle counter or the like. A result thereof is shown in the graph of FIG. 5.

Comparative Example 2

First, the pre-purge process was performed in the substrate processing system 10 kept at the stand-by state for a long period of time while setting the supply flow rate of the carrier gas in the processing of FIG. 2 to be the same as that of the carrier gas in the film forming process and, then, the film forming process was performed on two wafers in the film forming processing unit 11. Next, the number of particles, having a size of 0.10 μm or more, attached to the surface of each wafer after the film forming process was measured. A result thereof is shown in the graph of FIG. 5.

As shown in the graph of FIG. 5, it is found by comparison between the comparative examples 1 and 2 that the outflow of the particles from the interior of the ampoule 14 or the like in the film forming process can be suppressed by performing the pre-purge process. However, it is also found that even if the pre-purge process is performed while setting the supply flow rate of the carrier gas or that of the additional gas to be the same as that of the carrier gas or that of the additional gas in the film forming process, the number of particles attached to the surface of each wafer cannot be reduced to a target value of 30 or less.

Meanwhile, it is found by comparison between the comparative example 2 and the test example 1 or 2 that in the case of performing the pre-purge process, the greater viscous force can act on the particles P by increasing the supply flow rate of the carrier gas or decreasing the supply flow rate of the additional gas. Accordingly, most of the particles P can be removed from the interior of the ampoule or the like. As a result, the particles P can be prevented from being discharged from the interior of the ampoule 14 or the like and introduced into the film forming processing unit 11 in the film forming process.

INDUSTRIAL APPLICABILITY

In accordance with the method of cleaning a powdery source supply system, the storage medium, the substrate processing system and the substrate processing method, when the opening/closing valve of the introduction line for introducing the mixture of the carrier gas and the powdery source from the chamber to the film forming processing unit is closed and the interior of the purge line branched from the introduction line is evacuated by the gas exhaust unit prior to the film forming process, the carrier gas supply unit supplies the carrier gas so that the viscous force acting on particles by the carrier gas is greater than viscous force acting on particles by the carrier gas in the film forming process. Thus, the viscous force greater than the viscous force in the film forming process can act on the particles growing in the introduction line or the chamber. Accordingly, not only the particles moving by the viscous force in the film forming process but also particles P larger than those particles can be moved prior to the film forming process. Moreover, the moving particles are sent to the purge line, without being sent to the introduction line, by the exhaust flow in the purge line and then discharged from the purge line. In other words, most of the particles that can move by the viscous force in the film forming process can be removed from the chamber or the introduction line prior to the film forming process. As a result, it is possible to prevent outflow of the particles from the chamber or the introduction line like in the film forming process.

In accordance with the method of cleaning a powdery source supply system, the carrier gas supply unit supplies the carrier gas into the chamber at a supply flow rate greater than a supply flow rate in the film forming process, so that the flow rate of the carrier gas in the introduction line or the chamber can be increased. Further, since the viscous force is in proportion to the square of the flow rate of the carrier gas, the viscous force acting on the particles can be made greater than the viscous force in the film forming process.

In accordance with the method of cleaning a powdery source supply system, the carrier gas supply unit supplies the carrier gas into the chamber at a supply flow rate increased by at least 25% from a supply flow rate in the film forming process. Accordingly, it is possible to surely make the viscous force acting on the particles greater than the viscous force in the film forming process.

In accordance with the method of cleaning a powdery source supply system, the additional gas supplying unit for supplying an additional gas into the introduction line supplies the additional gas at a supply flow rate smaller than a supply flow rate in the film forming process between the chamber and a branch point from which the purge line emanates.

Therefore, the amount of the additional gas exhausted by the gas exhaust unit through the purge line decreases, and a larger amount of the carrier gas can be exhausted by the gas exhaust unit. Accordingly, the pressure of the carrier gas in the chamber or the introduction line can be decreased. Further, the viscous force is in inverse proportion to the pressure in the interior of the introduction line or in the interior of the chamber, so that the viscous force acting on the particles can be made greater than the viscous force in the film forming process.

In accordance with the method of cleaning a powdery source supply system, the additional gas supply unit supplies the additional gas into the introduction line at a supply flow rate decreased by at least 40% from the supply flow rate in the film forming process, so that the viscous force acting on the particles can be made greater than the viscous force in the film forming process.

In accordance with the method of cleaning a powdery source supply system, the cleaning step is repeatedly performed, so that the particles can be reliably removed from the introduction line or the chamber of the substrate processing system prior to the film forming process.

In accordance with the method of cleaning a powdery source supply system, the carrier gas is supplied into the chamber so that a boundary layer is formed on the surface of the powdery source in the chamber. The flow of the carrier gas is not generated below the boundary layer, so that that the viscous force does not act on the powder particulates of the powdery source which do not protrude from the boundary layer. On the other hand, the flow of the carrier gas is generated above the boundary layer, so that the viscous force acts on the particles protruding from the boundary layer. Accordingly, the particles can be selectively removed from the chamber.

In accordance with the substrate processing system, the purge line is provided with the pressure control valve, so that the pressure in the interior of the chamber or the interior of the introduction line can be controlled to a desired low pressure via the purge line by the pressure control valve. As a result, the viscous force acting on the particles P can be made greater than the viscous force in the film forming process.

In accordance with the substrate processing system, the conductance of the purge line is greater than that of the introduction line provided between the film forming processing unit and the branch point from which the purge line emanates. Therefore, the exhaust of the carrier gas flowing in the purge line can be facilitated compared to that of the carrier gas flowing between the film forming processing unit and the branch point from which the purge line emanates during the film forming process. Accordingly, the pressure of the carrier gas in the chamber or that in the introduction line can be decreased. As a result, the viscous force acting on the particles can be made greater than the viscous force in the film forming process.

In accordance with the substrate processing system, the chamber has the ultrasonic vibration generator. When ultrasonic vibration is applied to the chamber, the particles float toward the surface of the powdery source in the chamber. Accordingly, the viscous force can reliably act on the particles.

In accordance with the substrate processing system, the introduction line is provided with the heater, so that the removal of the particles from the introduction line can be facilitated by thermal stress.

What is claimed is:

1. A method of cleaning a powdery source supply system in a substrate processing system including the powdery source supply system for supplying a powdery source and a film forming processing unit for performing a film forming process on a substrate by using the supplied powdery source, the powdery source supply system having a chamber for accommodating the powdery source, a carrier gas supply unit for supplying a carrier gas into the chamber, an introduction line for connecting the chamber and the film forming processing unit and introducing a mixture of the carrier gas and the powdery source from the chamber to the film forming processing unit, a purge line branched from the introduction line and connected to a gas exhaust unit, and an opening/closing valve for opening and closing the introduction line between the film forming processing unit and a branch point from which the purge line emanates, the method comprising:

a cleaning step in which the carrier gas supply unit supplies, when the opening/closing valve is closed and the interior of the purge line is evacuated prior to the film forming process by the gas exhaust unit, the carrier gas into the chamber so that viscous force acting on particles by the carrier gas is greater than viscous force acting on particles by the carrier gas in the film forming process, wherein the cleaning step is performed prior to the film forming process and the carrier gas is supplied at a predetermined flow rate into the chamber during the film forming process.

2. The method of claim 1, wherein in the cleaning step, the carrier gas supply unit supplies the carrier gas into the chamber at a supply flow rate greater than a supply flow rate in the film forming process.

3. The method of claim 2, wherein in the cleaning step, the carrier gas supply unit supplies the carrier gas into the chamber at a supply flow rate increased by at least 25% from the supply flow rate in the film forming process.

4. The method of claim 1, wherein the substrate processing system has, between the chamber and the branch point from which the purge line emanates, an additional gas supply unit for supplying an additional gas into the introduction line, and wherein in the cleaning step, the additional gas supply unit supplies the additional gas into the introduction line at a supply flow rate smaller than a supply flow rate in the film forming process.

5. The method of claim 4, wherein in the cleaning step, the additional gas supply unit supplies the additional gas at a supply flow rate decreased by at least 40% from the supply flow rate in the film forming process.

6. The method of claim 1, wherein the cleaning step is repeatedly performed.

7. The method of claim 1, wherein in the cleaning step, the carrier gas is supplied into the chamber so that a boundary layer is formed on a surface of the powdery source in the chamber.

8. A substrate processing method for performing the film forming process on the substrate after performing the method of cleaning a powdery source supply system described in claim 1.

9. A non-transitory computer readable storage medium storing a program for executing on a computer a method of cleaning a powdery source supply system in a substrate processing system including the powdery source supply system for supplying a powdery source and a film forming processing unit for performing a film forming process on a substrate by using the supplied powdery source, wherein the powdery source supply system has a chamber for accommodating the powdery source, a carrier gas supply unit for supplying a carrier gas into the chamber, an introduction line for connecting the chamber and the film forming processing unit and introducing a mixture of the carrier gas and the powdery source from the chamber to the film forming processing unit, a purge line branched from the introduction line and connected to a gas exhaust unit, and an opening/closing valve for opening and closing the introduction line between the film forming processing unit and a branch point from which the purge line emanates, wherein the method includes a cleaning step in which the carrier gas supply unit supplies, when the opening/closing valve is closed and the interior of the purge line is evacuated prior to film forming process by the gas exhaust unit, the carrier gas into the chamber so that viscous force acting on particles by the carrier gas is greater than viscous force acting on particles by the carrier gas in the film forming process, and wherein the cleaning step is performed prior to the film forming process and the carrier gas is supplied at a predetermined flow rate into the chamber during the film forming process.

10. The non-transitory computer readable storage medium of claim 9, wherein, in the cleaning step, the carrier gas supply unit supplies the carrier gas into the chamber at a supply flow rate greater than a supply flow rate in the film forming process.

11. The non-transitory computer readable storage medium of claim 10, wherein, in the cleaning step, the carrier gas supply unit supplies the carrier gas into the chamber at a supply flow rate increased by at least 25% from the supply flow rate in the film forming process.

12. The non-transitory computer readable storage medium of claim 9, wherein, in the cleaning step, the carrier gas is supplied into the chamber so that a boundary layer is formed on a surface of the powdery source in the chamber.

* * * * *